United States Patent [19]

Hasegawa et al.

[11] Patent Number: 5,318,868
[45] Date of Patent: Jun. 7, 1994

[54] PHOTOMASK AND METHOD FOR MANUFACTURING SEMICONDUCTOR DEVICE USING PHOTOMASK

[75] Inventors: Norio Hasegawa; Fumio Murai, both of Tokyo, Japan

[73] Assignee: Hitachi, Ltd., Tokyo, Japan

[21] Appl. No.: 883,532

[22] Filed: May 15, 1992

[30] Foreign Application Priority Data

May 20, 1991 [JP] Japan .................. 3-114364

[51] Int. Cl.⁵ .................................. G03F 9/00
[52] U.S. Cl. ........................ 430/5; 430/311; 430/320
[58] Field of Search ............. 430/5, 311, 320

[56] References Cited

U.S. PATENT DOCUMENTS 4,904,569  2/1990  Fukuda et al. ............ 430/311
5,045,417  9/1991  Okamoto ..................... 430/5

Primary Examiner—Marion E. McCamish
Assistant Examiner—Mark A. Chapman
Attorney, Agent, or Firm—Antonelli, Terry, Stout & Kraus

[57] ABSTRACT

A photomask which is suitable for a phase shift method and a method for manufacturing a semiconductor device using the photomask is disclosed. The photomask comprises a transparent area, a translucent area and an opaque are arranged in a particular manner relative to a shifter film. In particular, the different elements are arranged so that the lowering of intensity and the amplitude of a transmitted light in the transparent area caused by an unnecessary peripheral part of a shifter film are smaller than the lowering of the intensity and the amplitude of a transmitted light through a transparent area. This serves to prevent an undesirable influence of the unnecessary peripheral part of so that a shifter film can reading be prevented, and a connected pattern can be formed.

22 Claims, 7 Drawing Sheets

PHOTOMASK AND METHOD FOR MANUFACTURING SEMICONDUCTOR DEVICE USING PHOTOMASK

BACKGROUND OF THE INVENTION

The present invention relates to a photomask to be used for a phase shift method and a manufacturing method for a semiconductor device using such a photomask.

When various patterns, a wiring pattern, etc., to be used for a semiconductor device are formed, for example, a method in which a phase difference is made to occur in the transmitted light through a mask is proposed as one of the methods for, improving the resolution of patterns. This type of method is generally called a phase-shift method. In such a method, disclosed in a Japanese Patent Publication No. 62-50811, for example, exposure is performed using a mask in which a transparent film for changing the phase (hereinafter referred to as a shifter) of a transmitted light is formed at least on one of the transparent portions provided on both sides of an opaque portion. According to the method, the resolution of an exposure apparatus is remarkably improved and various kinds of which are finer pattern than those obtained in conventional devices can be formed.

The phase shift method is effective when a pattern is to be formed on a mask in which adjacent transparent portions are not touching. In a case, however, where a pattern is to be formed in which a pair of adjacent transparent portions are connected to each other in a part of the pattern, a peripheral part of a shifter has to be positioned in the connecting part, so that the light intensity in the part becomes zero and the pattern of a transparent portion which is originally continuous is separated into two portions. In a Japanese Patent laid-open No. 2-078216, it is disclosed that even if there is no opaque film, minute dark spots are formed in the peripheral part of a shifter. It is difficult, however, to control the formation of minute dark spots to be generated only in a part of a peripheral part of a shifter, and a dark groove-like pattern is formed in an area corresponding to the whole peripheral part. Even if it is intended to form a pattern in a part of a peripheral part of a shifter, a thin ring-shaped groove is formed around the shifter pattern. Therefore, it is necessary to prevent the generation of such a groove, which is an unnecessary part, by some way or other.

SUMMARY OF THE INVENTION

An object of the present invention is to offer a mask and its manufacturing method with which the above-mentioned problem can be solved, the phase inversion in a transparent portion can be relieved, and a complicated pattern can be formed by decreasing the lowering of light intensity in a boundary portion, that is, in a peripheral part of a shifter.

The above-mentioned object can be achieved in making the exposure dosage for a normal exposure area relatively different from the exposure dosage for an unnecessary peripheral part of a shifter to decrease the lowering of the exposure in the unnecessary peripheral part of the shifter. Furthermore, if the phase difference in the unnecessary peripheral part of a shifter is shifted from 180°, a more desirable result can be obtained. When it is assumed that the exposure dosage for a normal exposure area is 1, if the exposure dosage for an unnecessary peripheral part of a shifter is made to be 2, the exposure in the unnecessary peripheral part of a shifter is increased and the unnecessary dark part is removed. The lowering of light intensity in the shifter peripheral part can be relieved by making the phase difference in the unnecessary shifter peripheral part be shifted from 180°.

In order to realize this, an arrangement is made to make the transmittance in an unnecessary shifter peripheral part high and the transmittance in a normal exposure area low. By making the transmittance in the unnecessary shifter peripheral part high, even if the lowering of transmittance in the shifter peripheral part occurs, sufficient light quantity passes through the part, and a breakage of a pattern in the part does not occur. The adjustment of transmittance in a mask can be achieved by fixing a translucent film on a desired part, for example.

A normal exposure and an excessive exposure for different parts can be simultaneously realized in an exposing process by providing areas having different values of transmittance from each other in a mask. In a conventional method, it was necessary to expose the unnecessary part with a different mask and the process was complicated; in the present invention, however, there is no need to use such different masks and the invention can be very easily executed.

DETAILED DESCRIPTION OF THE PREFERRED EMBODIMENTS

Example 1

Figure 1A:
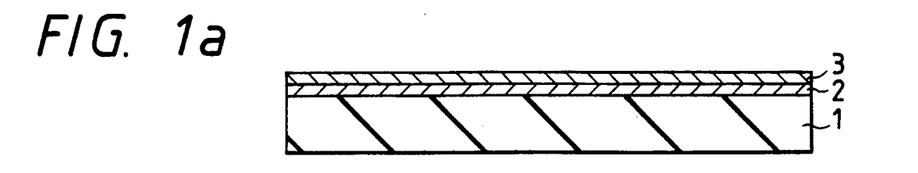
FIGS. 1a to 1c are process charts showing a first embodiment.

At first, as shown in FIG. 1a, a mask blanks was manufactured in forming a translucent film 2 and an opaque film 3 in lamination on a glass or quartz substrate 1. For the translucent film 2 an Si film was used, but it is not limited to the Si film and many kinds of metallic films can be used by selecting the film thickness properly. A Cr film was used as an opaque film 3, but films of Mo, Ta, W, etc. other than Cr can be used if the films can shield the exposure light.

Figure 1B:
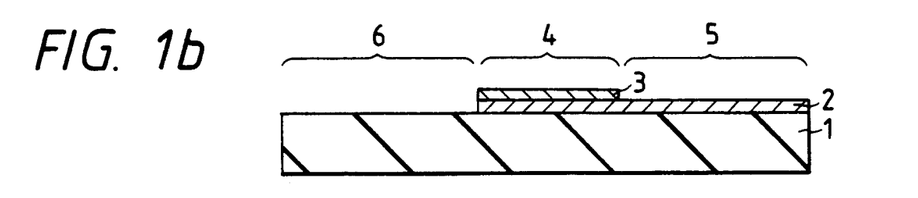

Next, as shown in FIG. 1b, leaving a desired part of the chromium film 3, the other part of it was removed by etching using an ordinary lithography. Then, an unnecessary part of the translucent film 2 was selectively removed using an ordinary lithography to expose a part of the glass substrate 1. The removal of the unnecessary part of the translucent film 2 can be performed with a method utilizing a spot irradiation of an ion beam or a laser beam. As clearly seen from FIG. 1b, an opaque portion 4 composed of a chromium film, a translucent portion 5 composed of a silicon film 2 and a transparent portion 6, an exposed part of the glass substrate 1, were formed as described in the above. In this case, the transmittance of an exposure light in each portion was: approximately 0% in the opaque portion 4, approximately 50% in the translucent portion 5 and approximately 100% in the transparent portion 6. The transmittance of light in the translucent portion 5 is not limited to 50%, and it can be properly changed according to an object pattern size or to the sensitivity of a resist film for projecting the pattern, etc. The desirable range of it is about 30% to 70%, and the value can be realized with an Si film 2 of 0.01 to 0.1 $\mu$m thick.

Figure 1C:
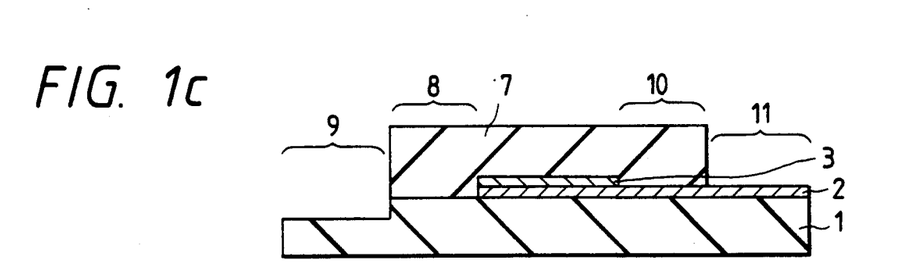

Next, as shown in FIG. 1c, a phase shifter 7 for giving phase shift to the transmitted light was fixed on the whole surface. In this case, an $SiO_2$ film was used as the phase shifter 7 but other films than $SiO_2$ film can be used. After that, a resist pattern was formed (not shown in the drawing) in a desired part with a known method, and using the resist pattern as a mask the unnecessary part of the shifter 7 was removed by etching. In the present embodiment, an electron beam drawing method was used, but since the Cr film and the silicon film have electric conductivity, a charge-up phenomenon which can occur in the case of the electron beam drawing method was prevented. A reactive ion etching method was used for the etching of the shifter, but other etching methods, a sputtering method, wet etching method using an etching liquid, etc., can be used. The etching of the shifter was kept on going after the shifter was removed and the glass substrate was also etched to a specified depth as shown in FIG. 1c. The depth of the engraved portion of the glass substrate was controlled so that the phase difference between the transmitted light through the shifter portion 8 and that through the engraved portion 9 can be about 90°±30° or about −90°±30°. In this case, in the area 11 the translucent film 2 functions as a stop layer, so that the glass substrate 1 is not etched. The film thickness of the shifter 7 was set so that the phase difference between the transmitted light through the ordinary shifter portion 10 and that through the transparent portion 11 can be 180°.

Figure 2:
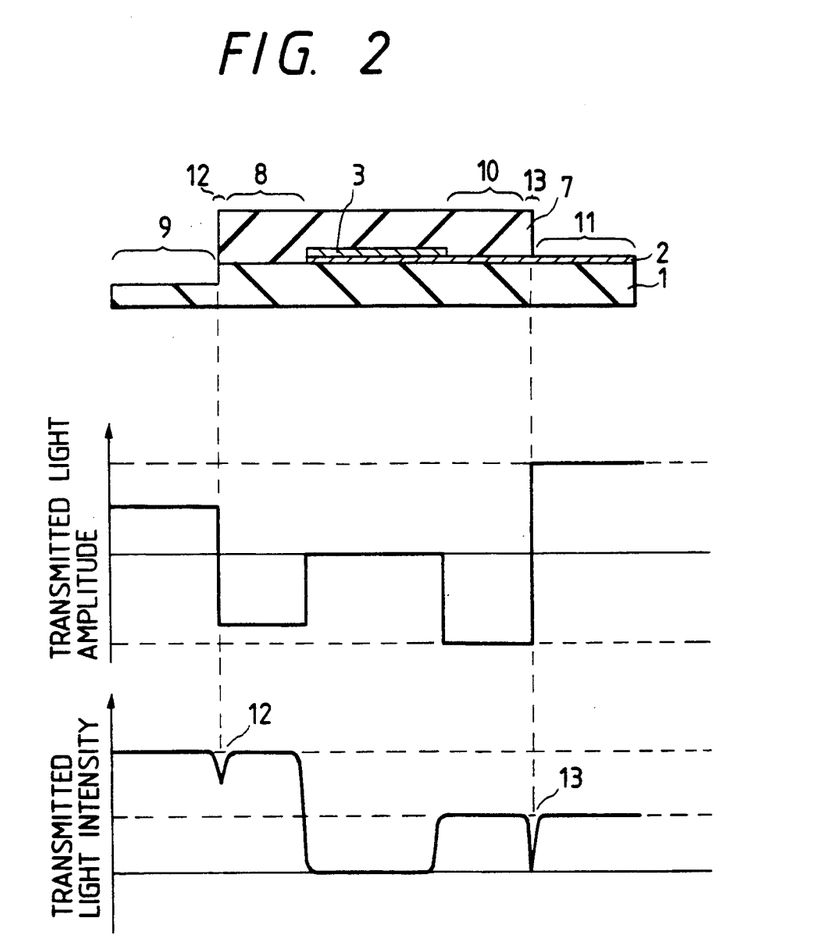
FIG. 2 is an illustrative representation for explaining the principle of the present invention.

After exposure was executed using a mask manufactured as described above, the resist film was developed and the pattern was transferred on the resist film. The amplitude distribution and the intensity distribution of the transmitted light obtained using the above-mentioned mask are shown in FIG. 2. It was confirmed in FIG. 2 that a minute line was formed using a shifter peripheral part 13 and no pattern was formed in the opposing shifter peripheral part 12. When the phase of the transmitted light through the transparent portion 11 is assumed to be a reference phase, the phases of the transmitted light through respective portions were: +180° in the normal shifter portion 10, +160° in the shifter portion 8 without having a silicon film 2, and −90° in the engraved portion 9 on the substrate 1. The values of the light intensity on the resist film were, assuming that the light intensity in the portion 8 having no translucent film 2 is 1, 0 and 5 respectively in the portions 10 and 11 having translucent films 2. The lowering of light intensity with the phase fluctuations was acknowledged in the shifter peripheral parts 12 and 13. The phase difference in the shifter peripheral part 13 was 180°, and the light intensity at the shifter peripheral part was approximately 0, showing an abrupt fall in the light intensity. The phase difference in the other shifter peripheral part 12 was 70° and the lowering of light intensity was little. Furthermore, since the light intensity of the background was high, the lowering of light intensity was remarkably controlled in comparison with that in a shifter peripheral part 13.

A pattern was transferred onto a wafer using a mask having a light intensity distribution as described in the above. In the result, when a negative type resist was used, a minute groove having a width of 0.15 $\mu$m was able to form on the resist right under the shifter peripheral part 13. No groove was formed under the shifter peripheral part 12. When a positive type resist was used, a minute line having the width of 0.20 $\mu$m was formed right under the shifter peripheral part 13. When the exposure dosage was increased further, a minute line having the width of 0.15 $\mu$m was formed. In these cases, in the shifter peripheral part 12, no pattern was formed. When an exposure dosage was decreased much, a pattern was formed, but a resist under a part having the translucent film 2 was not removed completely and a little resist remained.

In the case of a mask in which the phase of the transmitted light through the engraved portion 9 on the substrate 1 was set at −60°, the phase of the transmitted light in the shifter peripheral part 12 was +100°, and the lowering of light intensity was a little too large and a margin of exposure decreased a little. In the case of a mask in which a translucent film was made thinner to have a transmittance of 90%, a margin of exposure decreased too. Therefore, it is desirable that the phase of the transmitted light through the engraved part 9 is as close as possible to −90°.

Example 2

The present embodiment shows an example in which a pattern having such a shape as to meet a problem in forming an electrode wiring pattern of a semiconductor element, for example.

Figure 3A:
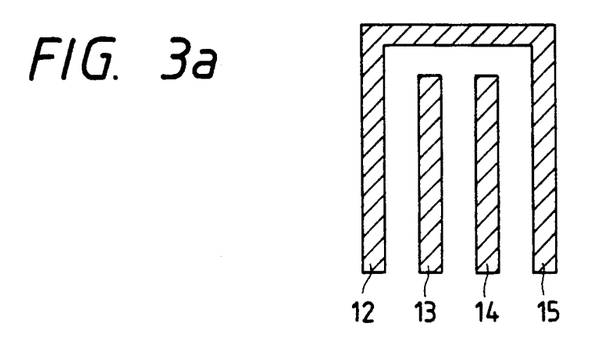
FIGS. 3a, 3b, 4a, and 4b are illustrative representations for explaining a second embodiment according to the present invention.
Figure 3B:
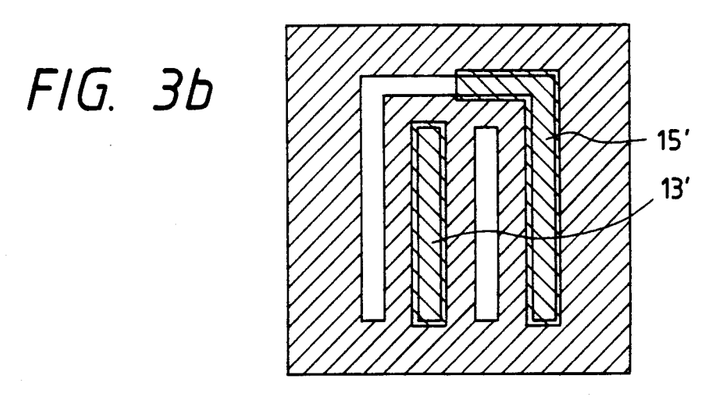

In FIG. 3a, patterns 13 and 14 are isolated patterns, and patterns 12 and 15 are connected by some point. A case where such a pattern is formed with a negative resist will be explained. In a mask to be used for forming such a pattern, the corresponding portions to respective patterns 12, 13, 14 and 15 become transparent portions as shown in FIG. 3b. When the pitches in the lateral direction in these patterns are minute, it is necessary to use a phase shift method. When shifters are to be disposed on every other line, the dispositions of shifters 13' and 15' show the condition of FIG. 3b. In this case, the peripheral part of the shifter 15' is positioned on the connecting point between the pattern 12 end the pattern 15. Therefore the light intensity is lowered in the part and the patterns are separated.

A preventive means for light intensity lowering at a shifter peripheral part shown in the embodiment 1 can be applied to such a part as described in the above to prevent the separation of patterns from each other.

Figure 4A:
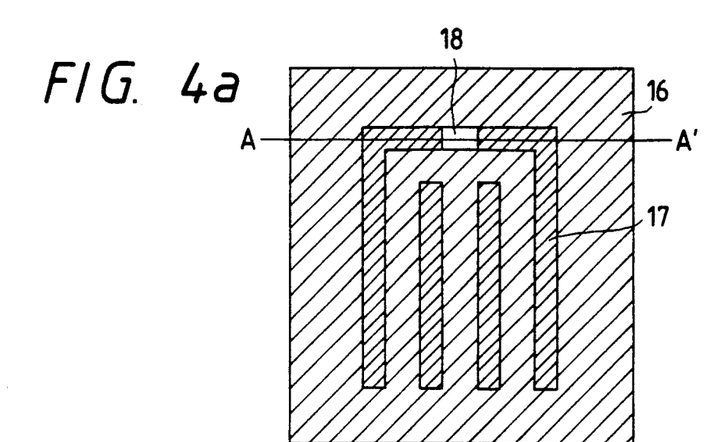

At first, a mask blanks as shown in FIG. 1a will be formed; next, a Cr film 16 in the wiring pattern portion is selectively removed by a well known etching method as shown in FIG. 4a. In a portion 17 where the Cr film 16 is removed, a translucent film is exposed. Next, the translucent film in an area 18 where a shifter peripheral part is positioned is selectively removed.

Figure 4B:
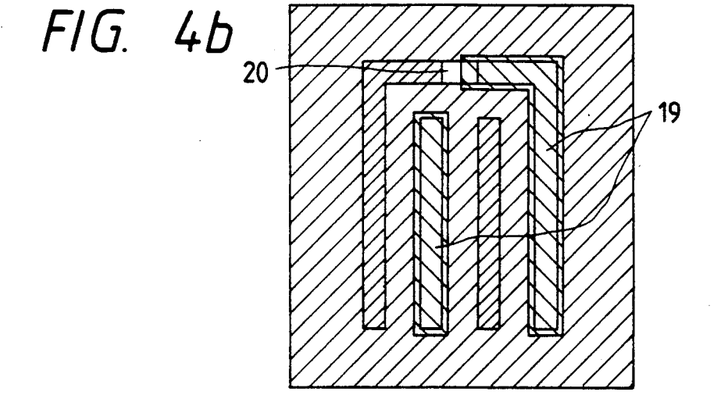

Next, a resist film is fixed on the whole surface, and an unnecessary part is removed with a lithography method to form a shifter pattern 19 as shown in FIG. 4b. The shifter film is etched for removing an unnecessary part using the resist film as a mask. In this case, a glass substrate 20 exposed by the etching of the shifter film was etched successively. Next, the resist film was removed to complete a mask. A pattern was transferred on a resist film with the mask, and in the result, similar to the case in the first embodiment, the lowering of light intensity was small and the break of a wiring pattern was prevented in an unnecessary shifter peripheral part.

Even when a mask in which the etching of the exposed part of a glass substrate is not performed is used, the break of wiring in the wiring pattern can be prevented tentatively, but the allowance for an optimized exposure dosage is small and it is difficult to use this for practical purposes. When the coherence of the exposure light is upgraded, the allowance for the optimized exposure dosage is made smaller. It is possible to prevent the transfer to a resist film in the shifter peripheral part having the phase difference of 180° by the difference in transmittance only, but the allowance for the optimized exposure dosage becomes small, and the optimized exposure is very difficult.

Example 3

In the present invention, a manufacturing process of a mask having a different pattern from that used in the embodiment 2 will be shown. FIGS. 5a to 5d correspond to the positions of A—A'.

Figure 5A:
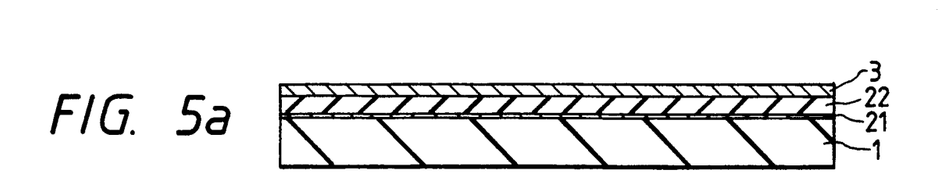
FIGS. 5a to 5d are manufacturing process charts showing a third embodiment according to the present invention.
Figure 5B:
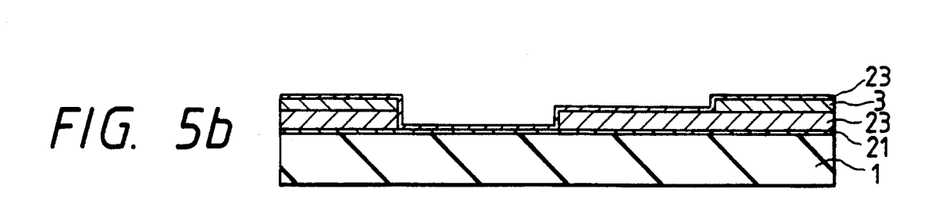

As shown in FIG. 5a, when a shifter layer is to be formed on a glass substrate 1, a mask blanks was formed in forming successively an etching stop layer 21, a shifter 22 and a Cr film 3. An ITO (indium tin oxide) film was used for an etching stop layer 21 for the shifter. An $SiO_2$ film was used as the shifter 22. Next as shown in FIG. 5b, a specified part of the Cr film 3 was removed. Next, a specified part of the shifter film 22 was etched to form an shifter peripheral part, and a translucent film 22 was formed on the whole surface. A Cr thin film being adjusted to have a transmittance of 50% was used as the translucent film 23.

Figure 5C:
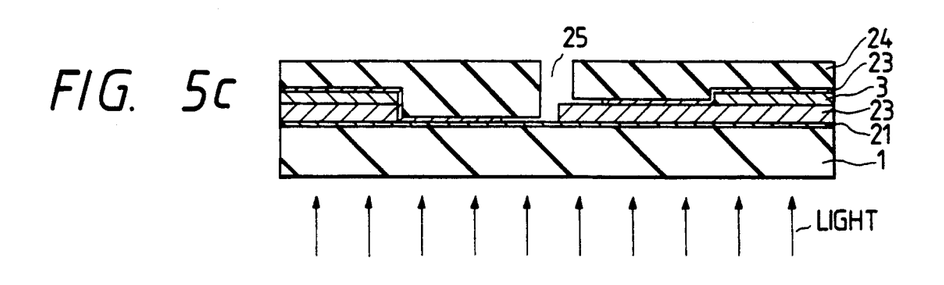
Figure 5D:
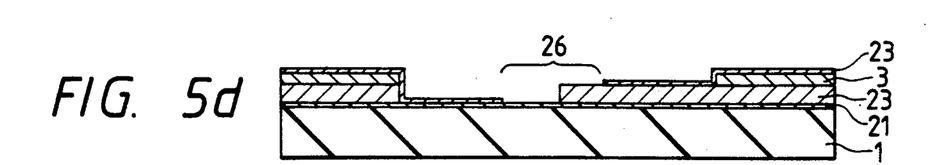

Next as shown in FIG. 5c, a negative type resist 24 was applied on the whole surface and light was irradiated from the back side. In this case, it is desirable to use a light having a high coherency. After that, a resist film 24 formed in the upper part 25 of a shifter periphery is removed by self-aligning etching. This is because of a fact that the light intensity is lowered by the phase-inversion at a shifter peripheral part and the hardening of the resist film 24 in the part was not enough.

Next, a translucent film 23 was etched using a remained resist film 24 as a mask. In this case, the etching was performed excessively, and side etching was made to occur as shown in FIG. 5c, and further a resist film 24 was removed. In the result, a mask having an area 26 of high transmittance was formed. In the case of the mask, the phase difference in a shifter peripheral part was 180°, and it was confirmed that the lowering of light intensity was large. A pattern was formed on a resist film formed on a water using the mask, and an exposure dosage was made to 1.5 times, owing to this it was made possible to prevent the transfer of a shifter peripheral part and to form patterns being connected to each other.

An ordinary lithography method was used for selectively removing a translucent film 25 for forming the area 26 having a high transmittance; in the result, it was possible to obtain the same mask constitution. The same results were also obtained by using an ion beam or a laser beam.

In other words, the transfer of a pattern was able to prevent by providing a plurality of areas having different values of transmittance from each other, disposing an unnecessary shifter peripheral part in an area of high transmittance, and shifting the phase difference in the part from 180°.

Example 4

In the present embodiment, an example in which the present invention is applied to a manufacture of minute gates of a semiconductor element.

Figure 6A:
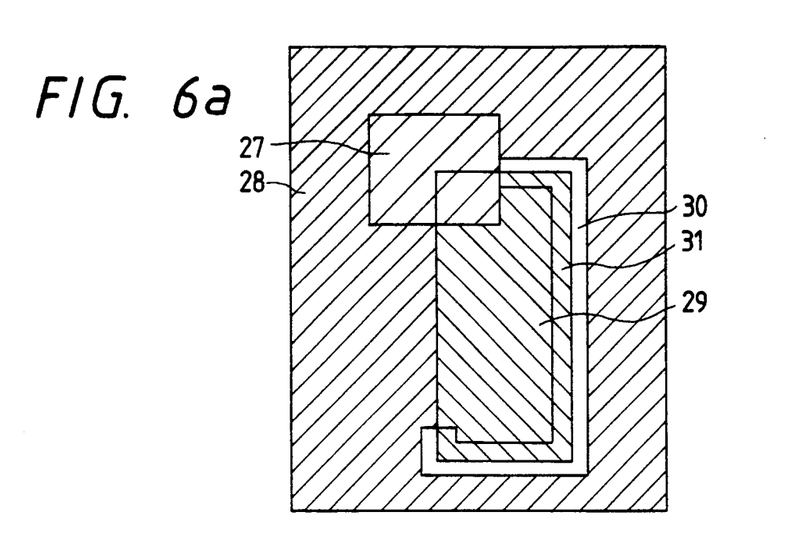
FIGS. 6a and 6b are the drawings showing a fourth embodiment according to the present invention.

In FIG. 6a, 27 is an opaque area, 28 is a translucent area, 29 is a shifter pattern formed area, and 30 and 31 are parts where the translucent film is removed. The area 30 is formed by etching the surface of a glass substrate and the phase difference between the transmitted light through the area 30 and the transmitted light through the area 31 is made to be 90°. The phase difference between the light through a shifter pattern 29 and that through a part being touched directly by a translucent film 28 (a left peripheral part of the pattern 28 in FIG. 6a) is made to be about 180° in adjusting the thickness of the shifter film.

Figure 6B:
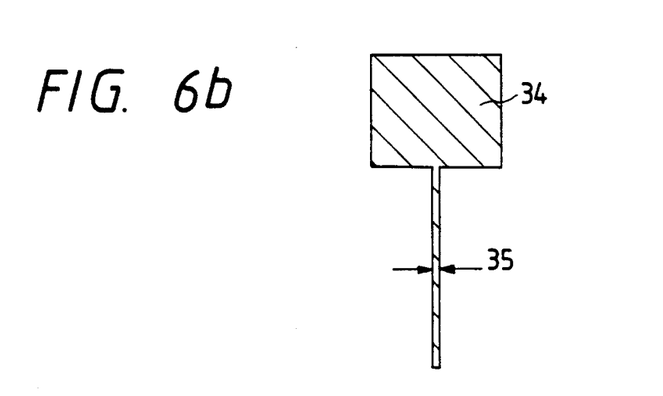

A pattern was transferred onto a resist film using the mask, and in the result a pattern 34 shown in FIG. 6b was formed and a minute gate having the dimension 35 of 0.15 $\mu$m was formed. In the other element manufacturing processes, elements were manufactured with a conventional method; the result of measurement of the characteristics showed that approximately equivalent characteristics were obtained to those of the minute gate obtained by an electron beam drawing method.

In the present embodiment, a similar result was obtained using a minute line-shaped shifter below a resolution limit as an opaque area 27; and a fine line-shaped pattern with a minute width was able to form by using only the areas 28 and 29 without using the opaque area 27.

Example 5

Figure 7A:
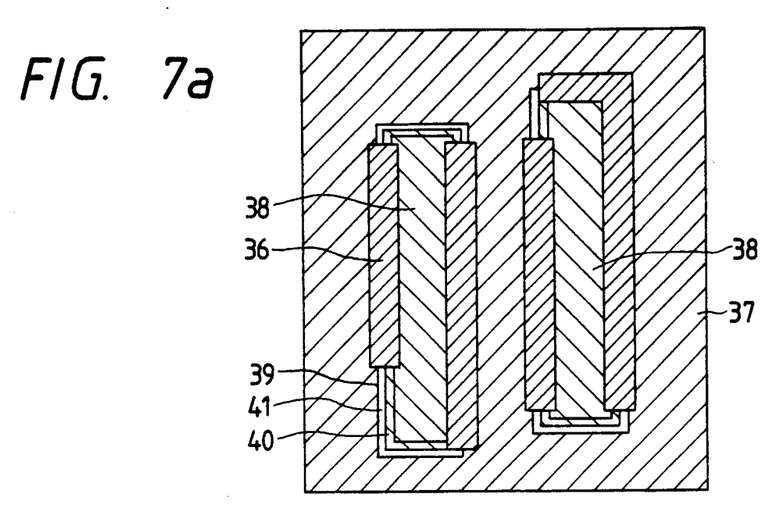
FIGS. 7a and 7b are the drawings showing a fifth embodiment according to the present invention.
Figure 7B:
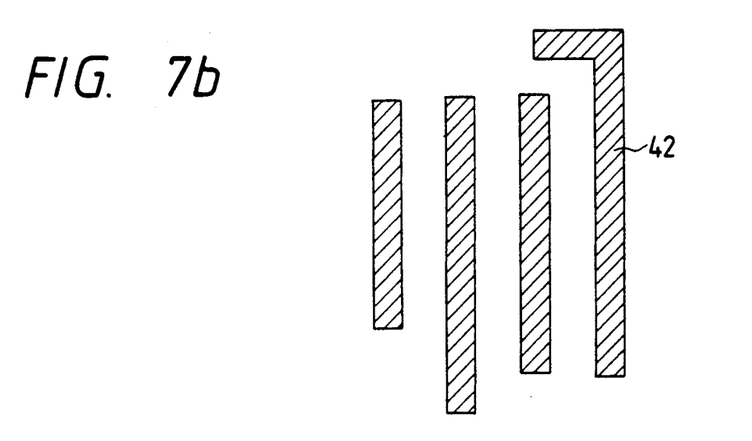

In the present embodiment, an example in which a wiring pattern was formed on a positive type resist film by a phase shift method will be shown. A photomask used in the present embodiment is shown in FIG. 7a and a plan view of an obtained resist pattern is shown in FIG. 7b. In FIG. 7a, an area 36 is an opaque area, 37 is a translucent area, 38 is a shifter pattern formed area, and 39 is a part where the translucent film is removed. An area 41 is formed by etching the surface of a glass substrate, and the phase difference between the transmitted lights through the area 40 and the area 41 was made to be approximately 90°. The phase difference between the transmitted lights through the area 37 and the area 38 is adjusted to be approximately 180°. In the result of transferring a pattern onto a positive type photoresist film using the mask, a wiring pattern 42 shown in FIG. 7b was formed.

As clearly seen from the explanation described in the above, it was made possible to dispose a shifter peripheral part in a transparent portion, and to avoid the trouble in disposing a shifter to a large extent, which had been a problem in applying the phase shift method to a complicated pattern; owing to this, the applicable range of the phase shift method was extended largely. Because of this, it was made possible to realize the manufacture of a ULSI with photolithography, which is very useful for industrial applications.

What is claimed is:
1. A photomask comprising:
   a transparent substrate having an engraved part;

a translucent film having a predetermined shape formed on said substrate over a portion other than said engraved part;

an opaque film having a predetermined shape formed in a predetermined area on said translucent film; and a shifter film, having a first peripheral part and a second peripheral part, wherein said shifter film is disposed to cover predetermined parts of the surfaces of said transparent substrate other than said engraved part, said opaque film and said translucent film, wherein a height of a main surface of said engraved part of said transparent substrate is lower than the height of a main surface of the rest of said transparent substrate other than said engraved part, and wherein said first peripheral part of said shifter film is disposed at a predetermined position of said translucent film, and said second peripheral part of said shifter film and a peripheral part of said engraved part of said transparent substrate are substantially in the same position.

2. A photomask according to claim 1, wherein the shifter film completely covers the opaque film.

3. A photomask as defined in claim 1 wherein said transparent substrate is composed of glass or quartz.

4. A photomask as defined in claim 1 wherein said translucent film is composed of Si or a metal.

5. A photomask as defined in claim 4 wherein the thickness of said Si film is 0.01 to 0.1 μm.

6. A photomask as defined in claim 1 wherein said opaque film is comprised of an element selected out of a group being composed of Cr, Mo, Ta and W.

7. A photomask as defined in claim 1 wherein said shifter film is comprised of $SiO_2$ or $Si_3N_4$.

8. A photomask described in claim 1 wherein the phase of a transmitted light through a thinner thickness part of said transparent substrate is 90°±30° or −90°±30°.

9. A photomask as defined in claim 1 wherein the phase difference between the transmitted light through an area where only said translucent film is formed and the transmitted light through an area where said translucent film; and said shifter film are formed being laminated together is approximately 180°.

10. A photomask comprising: a translucent film having a predetermined shape, an opaque film having a predetermined shape, and a shifter film having a predetermined shape formed on a transparent substrate having an engraved part wherein the intensity and amplitude of a transmitted light through a first peripheral part of said shifter film abutting to said translucent film and the intensity and amplitude of a transmitted light through a second peripheral part of said shifter film abutting to said transparent substrate are different from each other, respectively, wherein a height of a main surface of said engraved part of said transparent substrate is lower than the height of a main surface of the rest of said transparent substrate other than said engraved part, and wherein said first peripheral part of said shifter film is disposed at a predetermined position of said translucent film, and said second peripheral part of said shifter film and a peripheral part of said engraved part of said transparent substrate are substantially in the same position.

11. A photomask according to claim 10, wherein the shifter film completely covers the opaque film.

12. A method for manufacturing a semiconductor device comprising the steps of providing an exposure light to a predetermined area of a resist film through a photomask, and forming a predetermined pattern in developing said resist film, wherein said photomask comprises:

a transparent substrate having an engraved part;

a translucent film having a predetermined shape formed on said substrate over a portion other than said engraved part;

an opaque film having a predetermined shape formed in a predetermined area on said translucent film; and a shifter film, having a first peripheral part and a second peripheral part, wherein said shifter film is disposed to cover predetermined parts of the surfaces of said transparent substrate other than said engraved part, said opaque film and said translucent film, wherein a height of a main surface of said engraved part of said transparent substrate is lower than the height of a main surface of the rest of said transparent substrate other than said engraved part, and wherein said first peripheral part of said shifter film is disposed at a predetermined position of said translucent film, and said second peripheral part of said shifter film and a peripheral part of said engraved part of said transparent substrate are substantially in the same position.

13. A photomask according to claim 12, wherein the shifter film completely covers the opaque film.

14. A method as defined in claim 12 wherein said transparent substrate is comprises of glass or quartz.

15. A method as defined in claim 12 wherein said translucent film is comprises of Si or a metal.

16. A method as defined in claim 15 wherein the film thickness of said Si film is 0.01 to 0.1 μm.

17. A method as defined in claim 12 wherein said opaque film is comprised of an element selected out of a group being comprises of Cr, Mo, Ta and W.

18. A method, as defined in claim 12 wherein said shifter film is comprised of $SiO_2$ or $Si_3N_4$.

19. A method as defined in claim 12 wherein the phase of a transmitted light through a part having a thinner thickness of said transparent substrate is 90°±30° or −90°±30°.

20. A method as defined in claim 12 wherein the phase difference between a transmitted light through an area where only said translucent film is formed and a transmitted light through an area where said translucent film and said shifter film are laminated to one another is approximately 180°.

21. A method for manufacturing a semiconductor device comprising the steps of: a step for giving an exposure light to a predetermined area on a resist film through a photomask and a step for forming a predetermined pattern in developing said resist film; said photomask comprising: a translucent film having a predetermined shape formed on said transparent substrate having an engraved part, an opaque film having a predetermined shape, and a shifter film having a predetermined shape wherein the intensity and amplitude of a transmitted light through a first peripheral part of said shifter film abutting to said translucent film and the intensity and amplitude through a second peripheral part of said shifter film abutting to said transparent substrate are different from each other, respectively, wherein a height of a main surface of said engraved part of said transparent substrate is lower than the height of a main surface of the rest of said transparent substrate other than said engraved part, and wherein said first peripheral part of said shifter film is disposed at a predetermined position of said translucent film, and said second peripheral part of aid shifter film and a peripheral part of said engraved part of said transparent substrate are substantially in the same position.

22. A photomask according to claim 21, wherein the shifter film completely covers the opaque film.

* * * * *